(12) United States Patent
Shim

(10) Patent No.: US 8,237,487 B2
(45) Date of Patent: *Aug. 7, 2012

(54) LEVEL SHIFT CIRCUIT AND DISPLAY DEVICE HAVING THE SAME

(75) Inventor: Yeon Tack Shim, Hwasung-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/118,120

(22) Filed: May 27, 2011

(65) Prior Publication Data

US 2011/0227899 A1      Sep. 22, 2011

Related U.S. Application Data

(62) Division of application No. 12/591,398, filed on Nov. 18, 2009, now Pat. No. 7,952,415.

(30) Foreign Application Priority Data

Nov. 25, 2008   (KR) .................. 10-2008-0117614

(51) Int. Cl.
*H03L 5/00* (2006.01)
(52) U.S. Cl. ............... 327/333; 326/62; 326/81
(58) Field of Classification Search .......... 326/62–63, 326/80–81; 327/333, 306
See application file for complete search history.

(56) References Cited

U.S. PATENT DOCUMENTS

| | | | |
|---|---|---|---|
| 6,476,637 B1 | 11/2002 | Brownlow et al. | |
| 6,922,095 B2 | 7/2005 | Chiu | |
| 6,930,518 B2 | 8/2005 | Kim et al. | |
| 6,933,755 B2 * | 8/2005 | Hong et al. | 327/108 |
| 6,946,893 B2 | 9/2005 | Hayashi et al. | |
| 7,215,146 B2 * | 5/2007 | Khan | 326/83 |
| 7,227,400 B1 * | 6/2007 | Gillespie et al. | 327/333 |
| 7,414,435 B2 | 8/2008 | Kuzmenka et al. | |
| 7,468,615 B1 * | 12/2008 | Tan et al. | 326/68 |
| 7,737,755 B2 * | 6/2010 | Mauthe et al. | 327/333 |
| 2007/0279093 A1 | 12/2007 | Senda et al. | |

FOREIGN PATENT DOCUMENTS

| | | |
|---|---|---|
| JP | 2008-022539 A | 1/2008 |
| KR | 10-0479765 B1 | 3/2005 |
| KR | 10-2007-0007669 A | 1/2007 |
| KR | 10-2007-0116451 A | 12/2007 |

* cited by examiner

*Primary Examiner* — Dinh T. Le
(74) *Attorney, Agent, or Firm* — Lee & Morse, P.C.

(57) ABSTRACT

A level shift circuit includes a level shifter, the level shifter configured to receive input signals and generate level-shifted signals by level-shifting the input signals, an output buffer that includes a first sourcing circuit and a first sinking circuit, the first sourcing circuit and the first sinking circuit being connected in series between a first power and a second power, a first buffer coupled between the level shifter and the output buffer, the first buffer configured to buffer the level-shifted signals and provide a first driving signal to the first sourcing circuit, and a second buffer coupled between the level shifter and the output buffer, the second buffer configured to buffer the level-shifted signals and provide a second driving signal to the first sinking circuit.

16 Claims, 3 Drawing Sheets

LEVEL SHIFT CIRCUIT AND DISPLAY DEVICE HAVING THE SAME

CROSS REFERENCE TO RELATED APPLICATION

This is a divisional application based on application Ser. No. 12/591,398, filed Nov. 18, 2009, now U.S. Pat. No. 7,952,415 the entire contents of which is hereby incorporated by reference.

BACKGROUND

1. Field

Embodiments relate to a level shift circuit and a display device having the same.

2. Description of the Related Art

As a size of a display panel, e.g., a liquid crystal display (LCD) panel, is increased, a panel load that is driven by a gate driver integrated circuit (IC) may also increase. Accordingly, a size of an output buffer included in the gate driver IC should be increased. As a result, a short current occurring when a panel load is driven may increase. However, when the short current increases, an operating current of whole level shift circuit may increase and an abnormal voltage drop may occur in a power on/off section. In addition, an on/off operation of a transistor may not be completely performed according to a voltage applied to a gate of a buffer, which may cause a leakage current. The short current or the leakage current may negatively affect performance of the level shift circuit.

SUMMARY

Embodiments are therefore directed to a level shift circuit and a display device having the same, which substantially overcome one or more of the problems due to the limitations and disadvantages of the related art.

It is therefore a feature of an embodiment to provide a level shift circuit configured to reduce a short current in an output buffer by reducing an overlapping 'ON' time of transistors in the output buffer.

It is therefore another feature of an embodiment to provide a level shift circuit configured to reduce leakage current in buffers that drive an output buffer.

At least one of the above and other features and advantages may be realized by providing a level shift circuit, including a level shifter, the level shifter configured to receive input signals and generate level-shifted signals by level-shifting the input signals, an output buffer that includes a first sourcing circuit and a first sinking circuit, the first sourcing circuit and the first sinking circuit being connected in series between a first power and a second power, a first buffer coupled between the level shifter and the output buffer, the first buffer configured to buffer the level-shifted signals and provide a first driving signal to the first sourcing circuit, and a second buffer coupled between the level shifter and the output buffer, the second buffer configured to buffer the level-shifted signals and provide a second driving signal to the first sinking circuit.

The first buffer may include a second sourcing circuit and a second sinking circuit connected in series between the first power and the second power, the second buffer may include a third sourcing circuit and a third sinking circuit connected in series between the first power and the second power, operation of the second sourcing circuit may be controlled in response to a first level-shifted signal, and operation of the third sinking circuit may be controlled in response to a second level-shifted signal.

There may be a time difference between a time point when the first driving signal transitions to one of the first power voltage and the second power voltage and a time point when the second driving signal transitions to the one of the first power voltage and the second power voltage.

A time point when the first driving signal transitions from a voltage of the first power to a voltage of the second power may be later than a time point when the second driving signal transitions from a voltage of the first power to a voltage of the second power.

A time point when the first driving signal transitions from a voltage of the second power to a voltage of the first power may be earlier than a time point when a second driving signal transitions from a voltage of the second power to a voltage of the first power.

The time difference between time points when the first driving signal and the second driving signal are respectively transitioned to one of the first power voltage and the second power voltage may be based on a ratio of a channel width to a channel length of each transistor included in the second sourcing circuit and the second sinking circuit, respectively.

The level shifter may include a diode-connected transistor, the sourcing operation of the second sourcing circuit may be controlled in response to the first level-shifted signal, the first level-shifted signal being output from a source terminal of the diode-connected transistor, and the sinking operation of the third sinking circuit may be controlled in response to the second level-shifted signal, the second level-shifted signal being output from a drain terminal of the diode-connected transistor.

The second sourcing circuit may provide the first power to the first sourcing circuit, the second sourcing circuit controlling operation of the first sourcing circuit, the third sinking circuit may provide the second power to the first sinking circuit, the third sinking circuit controlling operation of the first sinking circuit, and the first level-shifted signal may have a voltage difference of Vth relative to the second power, and the second level-shifted signal has a voltage difference of Vth relative to the first power, Vth being a threshold voltage of the diode-connected transistor.

The second sourcing circuit may include a transistor configured to control a connection between the first power and the first sourcing circuit, the transistor of the second sourcing circuit having a threshold voltage Vth that is equal to the threshold voltage of the diode-connected transistor.

The third sinking circuit may include a transistor configured to control a connection between the second power and the first sinking circuit, the transistor of the third sinking circuit having a threshold voltage Vth that is equal to the threshold voltage of the diode-connected transistor.

The first buffer may include a first pull-up transistor controlled by the first driving signal and a first pull-down transistor controlled by the second driving signal, the second buffer may include a second pull-up transistor controlled by the first driving signal and a second pull-down transistor controlled by the second driving signal, the first pull-up transistor may be configured to control a connection between the first power and a first node, the first pull-down transistor may be configured to control a connection between the second power and the first node, the first pull-up transistor and the first pull-down transistor being connected in series between the first and second powers, the first node being between the first pull-up transistor and the first pull-down transistor, the second pull-up transistor may be configured to control a connection between the first power and a second node, the second pull-down transistor may be configured to control a connection between the second power and the second node, the second pull-up transistor and the second pull-down transistor being connected in series between the first and second powers, the second node being between the second pull-up transistor and the second pull-down transistor, a ratio of channel width to channel length of the first pull-up transistor may be greater than a ration of channel width to channel length of the second pull-up transistor, and a ratio of channel width to channel length of the first pull-down transistor may be less than a ratio of channel width to channel length of the second pull-down transistor.

At least one of the above and other features and advantages may also be realized by providing a display device, including a level shift circuit, and a display panel driven by a voltage output from the level shift circuit. The level shift circuit may include a level shifter, the level shifter configured to receive input signals and generate level-shifted signals by level-shifting the input signals, an output buffer that includes a first sourcing circuit and a first sinking circuit, the first sourcing circuit and the first sinking circuit being connected in series between a first power and a second power, a first buffer coupled between the level shifter and the output buffer, the first buffer configured to buffer the level-shifted signals and provide a first driving signal to the first sourcing circuit, and a second buffer coupled between the level shifter and the output buffer, the second buffer configured to buffer the level-shifted signals and provide a second driving signal to the first sinking circuit.

The first buffer may include a second sourcing circuit and a second sinking circuit connected in series between the first power and the second power, the second buffer may include a third sourcing circuit and a third sinking circuit connected in series between the first power and the second power, operation of the second sourcing circuit may be controlled in response to a first level-shifted signal, and operation of the third sinking circuit may be controlled in response to a second level-shifted signal.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION

Figure 1:
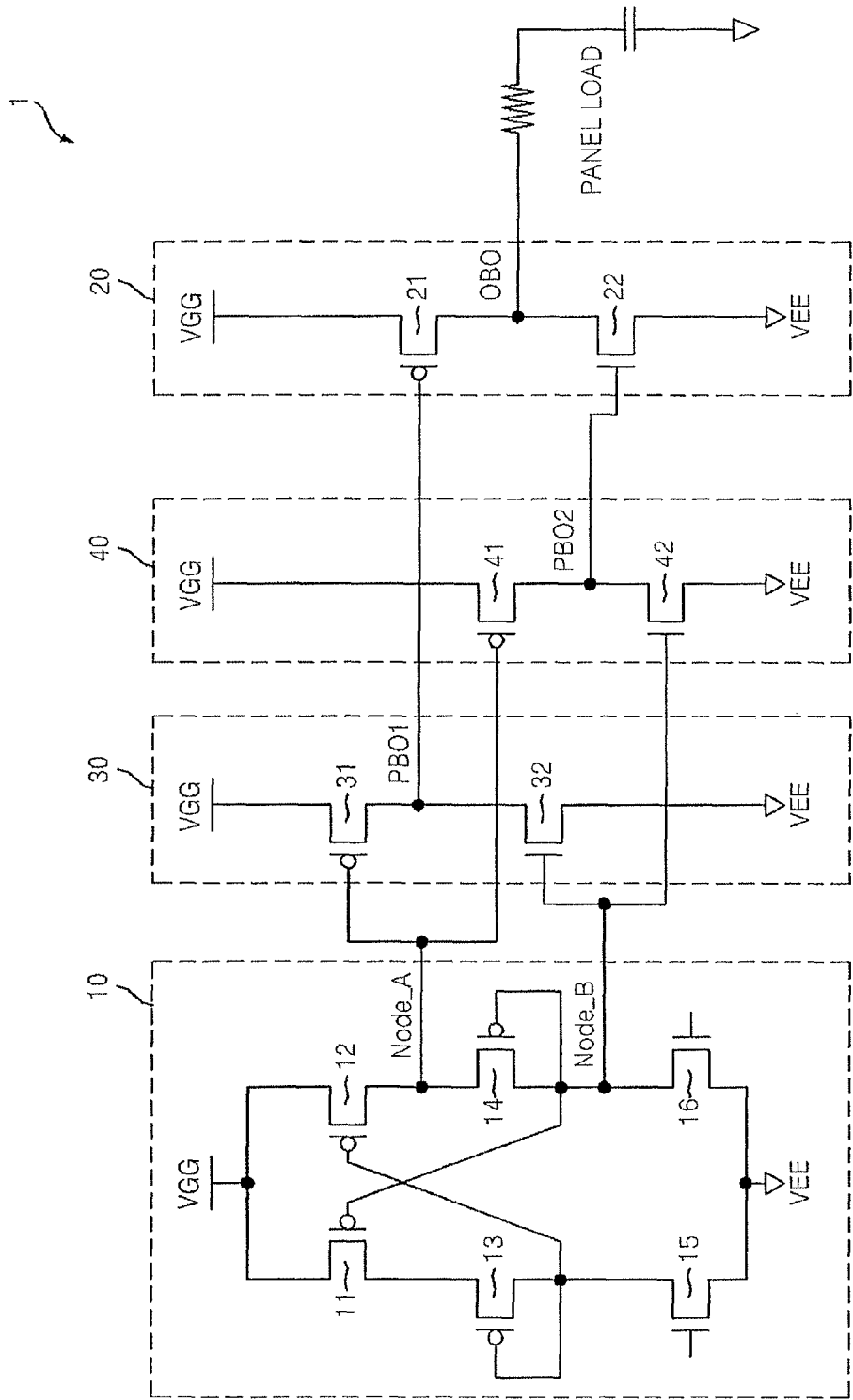
FIG. 1 illustrates a schematic circuit diagram of a level-shift circuit according to an example embodiment.

Korean Patent Application No. 10-2008-0117614, filed on Nov. 25, 2008, in the Korean Intellectual Property Office, and entitled: "Level Shift Circuit and Display Device Having the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions may be exaggerated for clarity of illustration. As used herein, the terms "directly connected" and "directly coupled" mean that two elements are connected or coupled to one another with no intervening elements, whereas the terms "connected" and "coupled" mean that the two elements may be directly connected or intervening elements may be present. Where an element is illustrated as being connected to another element, the element may be directly connected to the other element, or may be indirectly connected to the other element via one or more additional elements. In the drawings, elements may be omitted for simplicity and clarity. Like reference numerals refer to like elements throughout.

Embodiments may provide a level shift circuit capable of operating at a low voltage, minimizing a short current and accelerating an operation speed, and a display device having the same. Embodiments may also provide a level shift circuit capable of securing a maximum margin of an operation voltage and minimizing a leakage current in a buffer, and a display device having the same.

FIG. 1 illustrates a schematic circuit diagram of a level-shift circuit according to an example embodiment. In FIG. 1, two powers having respective voltage levels, which the level shift circuit 1 may supply to a load ("PANEL LOAD" in FIG. 1), are respectively illustrated as VGG (high voltage level) and VEE (low voltage level). In another implementation, the high and low voltages may be interchanged, and/or other voltages may be used.

The level shift circuit 1 may include a level shifter 10 and an output buffer 20. The level shift circuit 1 may also include a plurality of buffers, e.g., first and second buffers 30 and 40. The output buffer 20 and/or the plurality of buffers 30 and 40 may each include a plurality of transistors connected in series between a first power, e.g., VGG, and a second power, e.g., VEE, respectively. For example, each of the output buffer 20, the first buffer 30, and the second buffer 40 may include two transistors, the two transistors being connected in series between a first power VGG and a second power VEE. The two transistors may be a PMOS transistor and an NMOS transistor connected in series, i.e., connected by the source/drain electrodes thereof.

The level shifter 10 may include circuits configured to receive a signal (or signals) input thereto and configured to output an output signal (or signals), a level of which may be increased or decreased relative to a level of the received input signal. The level shifter 10 may include a level-up shifter or a level-down shifter.

As shown in FIG. 1, the level shifter 10 may include six transistors 11 to 16. The level shifter 10 may level-convert, i.e., level-shift an input voltage having a narrow voltage range, e.g., 2.5V to 3.6V, to an output voltage having a wide voltage range, e.g., 15V to 40V. When the level shifter 10 includes more than four transistors, e.g., six transistors, the level shifter 10 may convert a voltage level to a comparably wide range, thus securing a maximum operating voltage margin.

In another implementation (not shown), a second level shifter may be further included. The second level shifter may convert a voltage of, e.g., 2.5V to 3.6V at a front terminal of the level shifter 10 to a voltage of, e.g., 15V to 40V. Accordingly, a voltage having a range from VEE to VGG may be input to a gate of an NMOS transistor included in the level shifter 10.

As illustrated in FIG. 1, the level shifter 10 may include a pair of transistors 15 and 16 configured to receive differential signals input thereto, e.g., an input signal and an input bar signal. The pair of transistors 15 and 16 may be configured as a differential amplifier. The transistors 15, 16 may be NMOS transistors.

The level shifter 10 may also include a pair of transistors 13 and 14 that are diode-connected. The transistors 13, 14 may be PMOS transistors. The transistors 13 and 14 may be disposed between VGG on one side and the respective transistors 15 and 16 on the other side. The power VGG may be coupled to the transistors 13 and 14 through another pair of transistors 11 and 12. The transistors 11, 12 may be PMOS transistors. A source/drain electrode of the PMOS transistor 13 may be coupled to a gate electrode of the PMOS transistor 12. A source/drain electrode of the PMOS transistor 14 may be coupled to a gate electrode of the PMOS transistor 11. The diode-connected transistors 13, 14 may each have a threshold voltage that is Vth.

The level shifter 10 may include a first node Node_A and a second node Node_B, where the first node Node_A is a source of the diode-connected transistor 14 and the second node Node_B is a drain of the diode-connected transistor 14. The first node Node_A and the second node Node_B may each be connected to the first buffer 30 and the second buffer 40. For example, the first node Node_A may be connected to PMOS transistor 31 of the first buffer 30 as well as PMOS transistor 41 of the second buffer 40. The second node Node_B may be connected to NMOS transistor 32 of the first buffer 30 as well as NMOS transistor 42 of the second buffer 40. The PMOS transistors 31, 41 may each be configured as a pull-up circuit (or a sourcing circuit) and the NMOS transistors 32, 42 may each be configured as a pull-down circuit (or a sinking circuit).

By connecting two buffers 30 and 40 to two nodes Node_A and Node_B, a leakage current occurring in at least one of the buffers 30 and 40 may be controlled. For example, when the first node Node_A is at a first voltage level, e.g., a low level, a voltage level of the first node Node_A may be VEE+Vth. When the first node Node_A is at a second voltage level, e.g., a high level, a voltage level of the first node Node_A may be VGG.

Similarly, when the second node Node_B is at a first level, e.g., a low level, a voltage level of a second node Node_B may be VEE. When the second node Node_B is at a second level, e.g., a high level, a voltage level of the second node Node_B may be VGG-Vth.

As discussed above, the diode-connected transistors 13, 14 may each have a threshold voltage that is Vth. A threshold voltage of at least one of transistors 31, 32, 41, and 42 in the first and second buffers 30, 40, may also be equal to Vth. Thus, the threshold voltage of one or more of the diode-connected transistors 13, 14, may be equal to the threshold voltage of one or more of the transistors 31, 32, 41 and 42.

Further to the above, the transistor 31 may provide the first power, e.g., VGG, to the transistor 21 of the output buffer 20, the transistor 31 controlling the gate operation of the transistor 21. Also, the transistor 42 may provide the second power, e.g., VEE, to the transistor 22 of the output buffer 20, the transistor 42 controlling the gate operation of the transistor 22. In addition, as described above, the level-shifted signal provided from Node_A may be VEE+Vth, i.e., may have a voltage difference of Vth relative to the second power VEE, and the level-shifted signal provided from Node_B may be VGG-Vth, i.e., may have a voltage difference of Vth relative to the first power VGG, where Vth is a threshold voltage of one or more of the diode-connected transistors 13, 14, and one or more of the transistors 31, 32, 41 and 42.

By connecting the first node Node_A (having a voltage level range from VEE+Vth to VGG) to PMOS's 31 and 41 of the first buffer 30 and the second buffer 40, respectively, and by connecting the second node Node_B (having a voltage level range between VEE and VGG-Vth) to NMOS's 32 and 42 of the first buffer 30 and the second buffer 40, respectively, each transistor 31, 32, 41, and 42 may be prevented from turning on inadvertently. Accordingly, occurrence of a leakage current in buffer 30 and/or 40 may be reduced.

As described above, the level shift circuit 1 may include the output buffer 20. The first and second buffers 30, 40 may each be coupled to the output buffer 20. The output buffer 20 may include PMOS transistor 21 and NMOS transistor 22 connected in series between the first power, e.g., VGG, and the second power, e.g., VEE.

The output buffer 20 may be used to drive a load, e.g., a display panel, by buffering a voltage level transitioned by the level shifter 10, e.g., by buffering VGG or VEE. In FIG. 1, the load is shown as being provided by a display panel, and is schematically illustrated as a panel load PANEL LOAD having a predetermined effective resistance and predetermined effective capacitance.

In a general output buffer (not shown), a PMOS transistor and an NMOS transistor may receive and be driven by a same signal, i.e., by one signal. Because the output buffer drives the most load in a level shift circuit, the transition time of the PMOS transistor and NMOS transistor is significantly increased. Accordingly, a period during which the PMOS transistor and the NMOS transistor are both turned on at the same time is increased, thereby inducing a large short current in the general output buffer by providing a short-circuit path between the high and low voltage sources for a long period of time.

In contrast, in the level shift circuit 1 according to the instant embodiment, e.g., as shown in FIG. 1, the PMOS transistor 21 and the NMOS transistor 22 included in the output buffer 20 do not receive a common signal. Instead, the PMOS transistor 21 and the NMOS transistor 22 may be respectively connected to a first output terminal PBO1 of the first buffer 30 and a second output terminal PBO2 of the second buffer 40. For example, the first output terminal PBO1 of the first buffer 30 may be connected to a gate of the PMOS transistor 21 of the output buffer 20, and a second output terminal PBO2 of the second buffer 40 may be connected to a gate of the NMOS transistor 22 of the output buffer 20.

A ratio of a channel width to a channel length (i.e., width:length ratio of the transistor channel) of each transistor 31, 32, 41, and 42 included in the buffers 30 and 40, respectively, may be adjusted. In an implementation, the ratio may be adjusted so as to determine the rising time or falling time of a voltage of the first output terminal PBO1 and/or a voltage of the second output terminal PBO2. Thus, a period during which both the PMOS transistor 21 and the NMOS transistor 22 of the output buffer 20 are turned on simultaneously (i.e., the overlapping ON period that provides the short-circuit path) may be minimized. Accordingly, the period over which the transistors 21 and 22 in the output buffer 20 directly connect, i.e., short-circuit, VGG and VEE in the output buffer 20 may be decreased. Minimizing the overlapping ON period may thus decrease the amount of short current in the output buffer 20.

The overlapping ON period may be minimized by adjusting a ratio of a channel width to a channel length of each transistor 31, 32, 41, and 42 included in each of the buffers 30 and 40, and by controlling transition time of a voltage at the first output terminal PBO1 of the first buffer 30 and/or transition time of a voltage at the second output terminal PBO2 of the second buffer 40. In an implementation, a ratio of a channel width to a channel length of the PMOS transistor 31 of the first buffer 30 may be greater than a ratio of a channel width to a channel length of the PMOS transistor 41 of the second buffer 40. In an implementation, a ratio of a channel width to a channel length of the NMOS transistor 32 of the first buffer 30 may be smaller than a ratio of a channel width to a channel length of the NMOS transistor 42 of the second buffer 40.

By adjusting a ratio of a channel width to a channel length of each transistor 31, 32, 41, and 42, the voltage of the first output terminal PBO1 may be made to transition earlier than the voltage of the second output terminal PBO2 when the voltage of each output terminal PBO1 and PBO2 transitions from the first level, e.g., the low level, to the second level, e.g., the high level. Similarly, the voltage of the first output terminal PBO1 may be made to transition later than the voltage of the second output terminal PBO2 when the voltage of each output terminal PBO1 and PBO2 transitions from the second level to the first level.

According to an example embodiment, by increasing the difference in the ratio of channel width to channel length of each transistor 31, 32, 41, and 42, a temporal difference in the voltage transition of the each output terminal PBO1 and PBO2 may be increased. The level shift circuit 1 may make the transition time of signals respectively supplied to gates the transistors 21 and 22 in the output buffer 20 different each other. Accordingly, the level shift circuit 1 may minimize the overlapping ON period, and thereby minimize the short current between VGG and VEE via transistors 21, 22 occurring in the output buffer 20.

An operation of the level shift circuit 1 will now be described. As a starting point, it is assumed that a voltage at each of the output terminals PBO1 and PBO2 is at the second level, such that the PMOS transistor 21 is off and the NMOS transistor 22 is on. Then, when the output buffer 20 outputs a VGG voltage level, the voltage of the second output terminal PBO2 transitions first (from the second level to the first level), i.e., before than the voltage of the first output terminal PBO1 transitions (from the second level to the first level). The first-level voltage of the second output terminal PBO2 turns off the NMOS transistor 22 of the output buffer 20. Thereafter, the voltage of the first output terminal PBO1 transitions (from the second level to the first level). The first-level voltage of the first output terminal PBO1 turns on the PMOS transistor 21 of the output buffer 20. Therefore, the output buffer 20 may minimize the amount of the short current by decreasing the overlapping ON period during which the PMOS transistor 21 and the NMOS transistor 22 are turned on simultaneously.

Another operation of the level shift circuit 1 will now be described. As a starting point, it is assumed that a voltage of each of the output terminals PBO1 and PBO2 is at the first level, such that the PMOS transistor 21 is turned on and the NMOS transistor 22 is turned off. Then, the voltage of the output terminal PBO1 of the first buffer 30 transitions (from the first level to the second level, e.g., to the high level) to turn off the PMOS transistor 21. Then, to output a VEE voltage level, the voltage of the output terminal PBO2 of the second buffer 40 transitions last (from the first level to the second level), i.e., later than the voltage of the output terminal PBO1 of the first buffer 30 transitions (from the first level to the second level). Therefore, the output buffer 20 may minimize occurrence of a short circuit by decreasing an overlapping ON period where a PMOS 21 and an NMOS 22 are turned on simultaneously.

Figure 2:
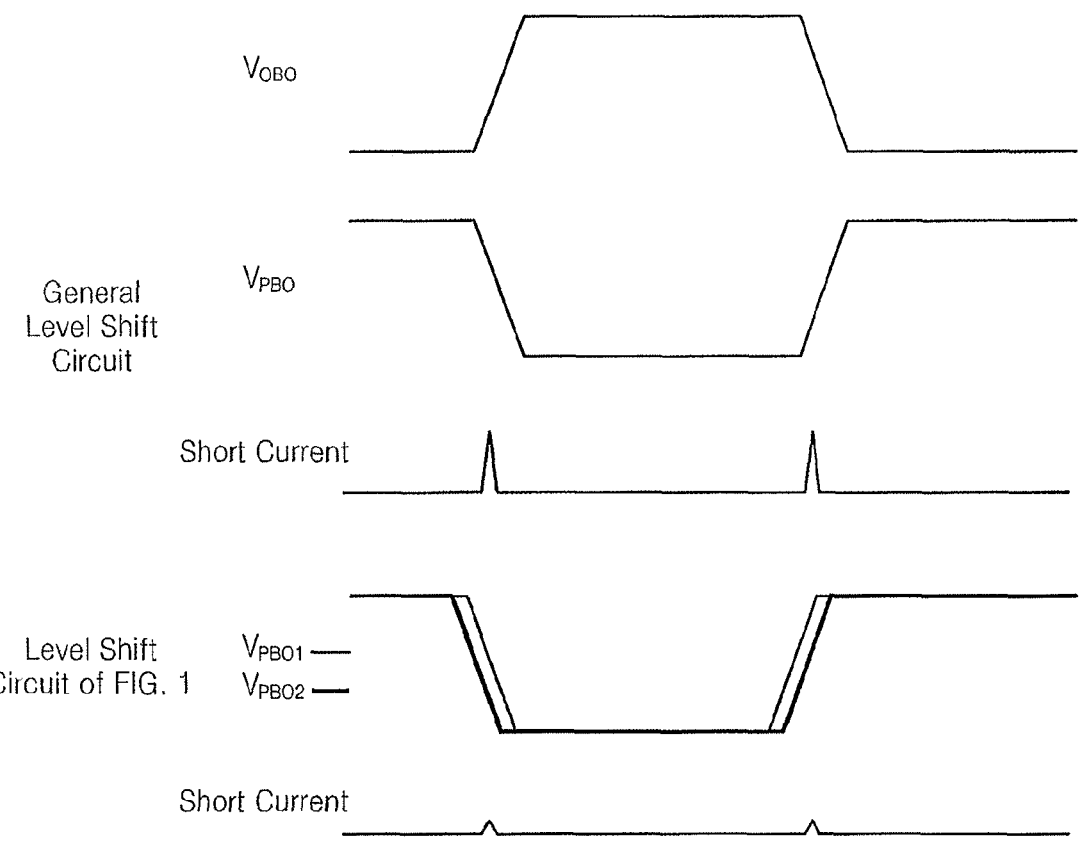
FIG. 2 illustrates a graph comparing a short current in a general level shift circuit to a current in the level shift circuit of FIG. 1.

FIG. 2 illustrates a graph comparing a short current in a general level shift circuit to a current in the level shift circuit of FIG. 1 according to an example embodiment. A PMOS transistor and an NMOS transistor included in the general output buffer are driven by a same signal. Thus, the general level shift circuit generates a large volume of short current at a time point when a voltage $V_{OBO}$ of an output terminal OBO of the output buffer transitions or when a voltage $V_{PBO}$ of an output terminal of a single buffer transitions.

In contrast, as illustrated in FIG. 2, the level shift circuit 1 according to the above-described example embodiment may cause a transition time of a voltage $V_{PBO1}$ of the first output terminal PBO1 of the first buffer 30 to be different from the transition time of the voltage $V_{PBO2}$ of the second output terminal PBO2 of the second buffer 40. Thus, the level shift circuit 1 may minimize an overlapping ON period and thereby control a short current occurring in the output buffer 20.

Figure 3:
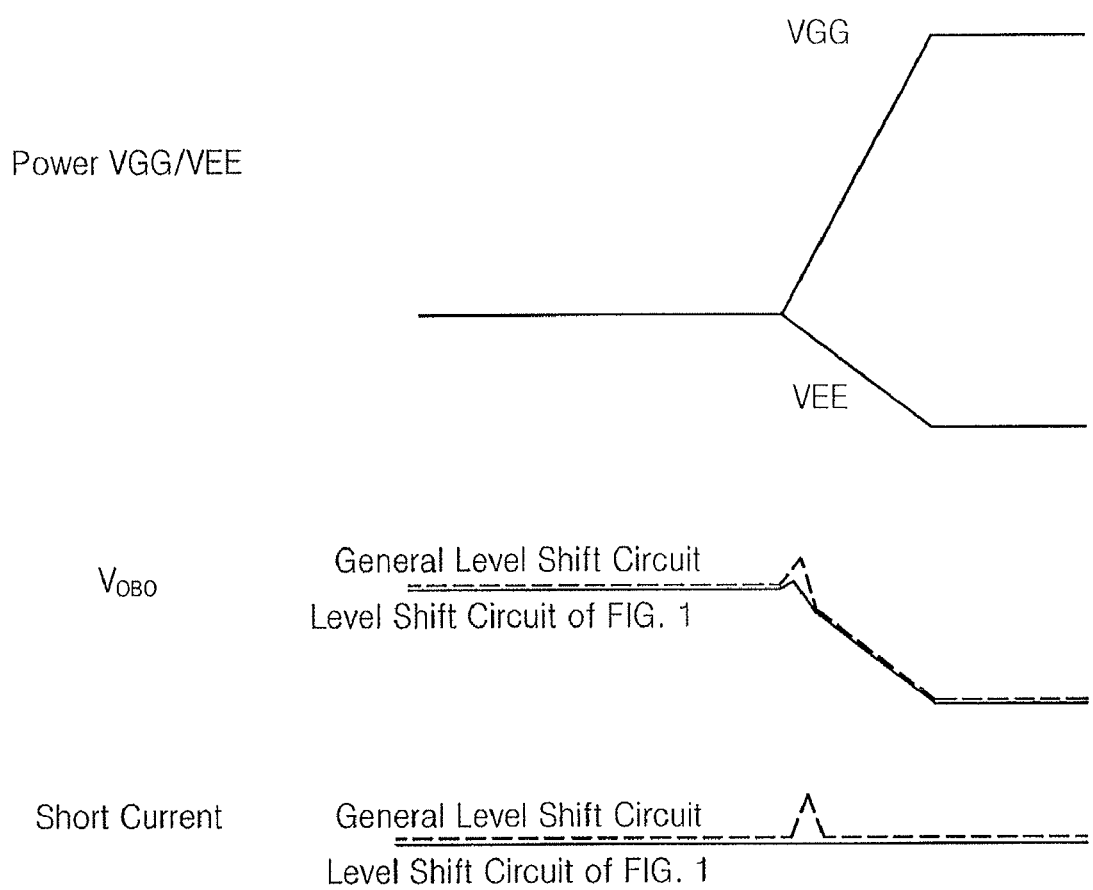
FIG. 3 illustrates a graph comparing a 'power on' sequence operation in a general level shift circuit to a 'power on' sequence operation in the level shift circuit of FIG. 1.

FIG. 3 illustrates a graph comparing a 'power on' sequence operation in a general level shift circuit to a 'power on' sequence operation in a level shift circuit of FIG. 1 according to an example embodiment.

Referring to FIGS. 1 and 3, the level shift circuit 1 according to the above-described embodiment may reduce a driving load of each buffer 30 and 40 by half because it separately drives the respective gates of the PMOS transistor 21 and the NMOS transistor 22 of the output buffer 20. Accordingly, the level shift circuit 1 may reduce delay time of each buffer 30 and 40.

Additionally, in the general level shift circuit a parasitic capacitor may be formed between an output terminal of the general level shift circuit and a VEE node. Further, a voltage of the output terminal may not be increased to a VGG voltage level when a power is on. Thus, a short current may occur in its early stage.

In contrast, the level shift circuit 1 according to the above-described embodiment drives a gate of the PMOS transistor 21 of the output buffer 20 separately from a gate of the NMOS transistor 22, so a load in each buffer 30 and 40 may be reduced, e.g., halved. Moreover, by removing a parasitic capacitor coupled with a VEE node, the level shift circuit 1 may make a voltage $V_{PBO1}$ of a buffer output PBO1 achieve a VGG voltage level quickly when a power is on, so that short current occurrence in its early stage may be maximally controlled.

As described above, embodiments may provide a level shift circuit capable of minimizing a short current or a leakage current, which may otherwise occur in an output buffer or a buffer, respectively. The level shift circuit may provide a margin of an operating voltage at maximum while consuming a low power. The level shift circuit may be used in a display device, e.g., a liquid crystal display, etc.

In an embodiment, a level shift circuit may separate each output voltage from each of two different buffers. and may apply them to a PMOS transistor or an NMOS transistor included in an output buffer. At least one of the two different buffers may be connected to each of two different nodes of the level shift circuit, respectively. Therefore, a short current occurring in the output buffer and a leakage current occurring in a buffer coupled to the output buffer may be minimized.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope as set forth in the following claims.

What is claimed is:

1. A level shift circuit, comprising:
   a level shifter, the level shifter configured to receive at least one input signal and generate level-shifted signals by level-shifting the input signal;
   an output buffer that includes a first sourcing circuit and a first sinking circuit, the first sourcing circuit and the first sinking circuit being connected in series between a first power and a second power; and a buffer coupled between the level shifter and the output buffer, the buffer configured to provide a first driving signal determined by the level-shifted signals to the first sourcing circuit and provide a second driving signal determined by the level-shifted signals to the first sinking circuit, the buffer including first and second transistors coupled in series with each other, the first transistor receiving one of the generated level-shifted signals and the second transistor receiving another one of the generated level-shifted signals, the buffer further including a third transistor and a fourth transistor coupled in series with each other, wherein the third transistor receives the same one of the generated level-shifted signals as the first transistor and the fourth transistor receives the another one of the generated level-shifted signals.

2. The level shift circuit as claimed in claim 1, wherein the buffer includes a first current branch corresponding to the first and the second transistors and a second current branch corresponding to the third and the fourth transistors, the first driving signal is determined by a first current flowing in the first current branch and the second driving signal is determined by a second current flowing in the second current branch.

3. The level shift circuit as claimed in claim 2, wherein the first current is determined by the level-shifted signals and the second current is determined by the level-shifted signals.

4. The level shift circuit as claimed in claim 1, wherein there is a time difference between a time point when the first driving signal transitions to one of a voltage of the first power and a voltage of the second power and a time point when the second driving signal transitions to the one of a voltage of the first power and a voltage of the second power.

5. The level shift circuit as claimed in claim 4, wherein a time point when the first driving signal transitions from a voltage of the first power to a voltage of the second power is later than a time point when the second driving signal transitions from a voltage of the first power to a voltage of the second power.

6. The level shift circuit as claimed in claim 4, wherein a time point when the first driving signal transitions from a voltage of the second power to a voltage of the first power is earlier than a time point when a second driving signal transitions from a voltage of the second power to a voltage of the first power.

7. The level shift circuit as claimed in claim 4, wherein the buffer includes a second sourcing circuit corresponding to the first transistor and a second sinking circuit corresponding to the second transistor connected in series between the first power and the second power, and the time difference between time points when the first driving signal and the second driving signal are respectively transitioned to one of a voltage of the first power and a voltage of the second power is based on a ratio of a channel width to a channel length of each transistor included in the second sourcing circuit and the second sinking circuit, respectively.

8. The level shift circuit as claimed in claim 1, wherein a first output node between the first and second transistors of the buffer is connected to the first sourcing circuit, and a second output node between the third and fourth transistors of the buffer is connected to the first sinking circuit.

9. A display device, comprising:
a level shift circuit; and
a display panel driven by a voltage output from the level shift circuit,
wherein the level shift circuit comprises:
a level shifter, the level shifter configured to receive at least one input signal and generate level-shifted signals by level-shifting the input signal;
an output buffer that includes a first sourcing circuit and a first sinking circuit, the first sourcing circuit and the first sinking circuit being connected in series between a first power and a second power; and
a buffer coupled between the level shifter and the output buffer, the buffer configured to provide a first driving signal determined by the level-shifted signals to the first sourcing circuit and provide a second driving signal determined by the level-shifted signals to the first sinking circuit, the buffer including first and second transistors coupled in series with each other, the first transistor receiving one of the generated level-shifted signals and the second transistor receiving another one of the generated level-shifted signals, the buffer further including a third transistor and a fourth transistor coupled in series with each other, wherein the third transistor receives the same one of the generated level-shifted signals as the first transistor and the fourth transistor receives the another one of the generated level-shifted signals.

10. The display device as claimed in claim 9, wherein the buffer includes a first current branch corresponding to the first and the second transistors and a second current branch corresponding to the third and the fourth transistors, the first driving signal is determined by a first current flowing on the first current branch and the second driving signal is determined by a second current flowing in the second current branch.

11. The level shift circuit as claimed in claim 10, wherein the first current is determined by the level-shifted signals and the second current is determined by the level-shifted signals.

12. The level shift circuit as claimed in claim 9, wherein there is a time difference between a time point when the first driving signal transitions to one of a voltage of the first power and a voltage of the second power and a time point when the second driving signal transitions to the one of a voltage of the first power and a voltage of the second power.

13. The level shift circuit as claimed in claim 12, wherein a time point when the first driving signal transitions from a voltage of the first power to a voltage of the second power is later than a time point when the second driving signal transitions from a voltage of the first power to a voltage of the second power.

14. The level shift circuit as claimed in claim 12, wherein a time point when the first driving signal transitions from a voltage of the second power to a voltage of the first power is earlier than a time point when a second driving signal transitions from a voltage of the second power to a voltage of the first power.

15. The level shift circuit as claimed in claim 12, wherein the buffer includes a second sourcing circuit corresponding to the first transistor and a second sinking circuit corresponding to the second transistor connected in series between the first power and the second power, and the time difference between time points when the first driving signal and the second driving signal are respectively transitioned to one of a voltage of the first power and a voltage of the second power is based on a ratio of a channel width to a channel length of each transistor included in the second sourcing circuit and the second sinking circuit, respectively.

16. The level shift circuit as claimed in claim 9, wherein a first output node between the first and second transistors of the buffer is connected to the first sourcing circuit, and a second output node between the third and fourth transistors of the buffer is connected to the first sinking circuit.

* * * * *